United States Patent [19]
Malwah

[11] Patent Number: 5,254,874
[45] Date of Patent: Oct. 19, 1993

[54] HIGH DENSITY LOCAL INTERCONNECT IN A SEMICONDUCTOR CIRCUIT USING METAL SILICIDE

[75] Inventor: Manohar L. Malwah, Los Altos Hills, Calif.

[73] Assignee: Quality Semiconductor Inc., Santa Clara, Calif.

[21] Appl. No.: 773,972

[22] Filed: Oct. 8, 1991

Related U.S. Application Data

[63] Continuation of Ser. No. 518,016, May 2, 1990, abandoned.

[51] Int. Cl.⁵ .................. H01L 27/02; H01L 23/48; H01L 29/46; H01L 29/54
[52] U.S. Cl. .................. 257/754; 257/51; 257/52; 257/369
[58] Field of Search .............. 357/42, 72; 257/49, 257/51, 52, 369, 377, 382–385, 750, 754, 757, 763, 770

[56] References Cited

U.S. PATENT DOCUMENTS

| | | |
|---|---|---|
| 4,141,022 | 2/1979 | Sigg et al. . |
| 4,443,930 | 4/1984 | Hwang et al. . |
| 4,549,914 | 10/1985 | Oh .................. 437/62 |
| 4,581,627 | 4/1986 | Ueda et al. .............. 357/90 |
| 4,596,604 | 6/1986 | Akiyama et al. . |
| 4,597,163 | 7/1986 | Tsang .................. 357/91 |
| 4,648,175 | 3/1987 | Metz, Jr. et al. .......... 357/42 |
| 4,679,310 | 7/1987 | Ramachandra et al. ...... 357/71 |
| 4,777,150 | 10/1988 | Deneuville et al. . |
| 4,785,341 | 11/1988 | Ning et al. . |
| 4,786,611 | 11/1988 | Pfiester . |
| 4,816,425 | 3/1989 | McPherson . |
| 4,873,204 | 10/1989 | Wong et al. .............. 437/193 |
| 4,933,994 | 6/1990 | Orban . |
| 4,946,803 | 8/1990 | Ellwanger . |
| 4,951,117 | 8/1990 | Kasai .................. 357/42 |
| 4,977,098 | 12/1990 | Yu et al. . |
| 4,988,643 | 1/1991 | Tsou . |
| 4,994,402 | 2/1991 | Chiu . |
| 5,043,778 | 8/1991 | Teng et al. .............. 357/42 |

FOREIGN PATENT DOCUMENTS

| | | |
|---|---|---|
| 0163132 | 4/1985 | European Pat. Off. . |
| 2614726 | 11/1988 | France . |
| 56-088366 | 7/1981 | Japan . |
| 63-316467 | 12/1988 | Japan . |
| 2151847 | 7/1985 | United Kingdom . |
| WO8403587 | 9/1984 | World Int. Prop. O. . |

OTHER PUBLICATIONS

L. D. Locker et al., "Reaction Kinetics of Tungsten Thin Films on Silicon (100) Surfaces", *Journal of Applied Physics*, vol. 44, (Oct. 1973) pp. 4366–4369.

Primary Examiner—J. Carroll
Attorney, Agent, or Firm—Majestic, Parsons, Siebert & Hsue

[57] ABSTRACT

A metal silicide layer in or on a body of silicon wafer is used for interconnecting two or more CMOS circuit devices. In addition to a polysilicon layer and a metal layer, the metal silicide layer provides an additional layer of local interconnect which can be performed at high density to reduce the size of the die while including the same number of circuit devices. An amorphous silicon layer doped at selected regions may be used as an additional interconnect.

15 Claims, 6 Drawing Sheets

HIGH DENSITY LOCAL INTERCONNECT IN A SEMICONDUCTOR CIRCUIT USING METAL SILICIDE

This is a continuation of application Ser. No. 518,016, filed May 2, 1990 now abandoned.

This invention relates in general to semiconductor circuits and in particular in the performing of high density local interconnect in semiconductor circuits using metal silicides.

With the advent of very large scale integrated circuits, it is desirable to reduce the space required for local interconnections between active circuit elements such as transistors which are located in a semiconductor material adjacent to one another. Conventional local interconnects employ one layer or two layers of metal to interconnect adjacent active circuit elements. Where two layers of metal are used, the two layers are stacked one above the other on top of the substrate of the integrated circuit medium. The two layers are usually separated by an insulating layer except at locations where they are intentionally connected to form circuit connections. One layer metal process is rather restrictive for the local interconnection technology because metal is also used for global interconnection in the integrated circuit. This results in a significant medium.

The two-layer metal process is somewhat difficult to control because of surface topology and restriction of low temperature processing after first layer metal interconnect.

Polysilicon has also been used for constructing interconnecting conductor lines for integrated circuits. It is stable at high temperatures, can be oxidized to form silicon dioxide thereon, and is suitable for etching fine lines. One disadvantage of polysilicon is its relatively high electrical resistance. To reduce resistance, a layer of silicon-rich metal silicide such as tungsten silicide is deposited on a doped polysilicon layer to form a metal silicide/polysilicon sandwich layer having a low resistivity. Such a scheme is described, for example, in U.S. Pat. No. 4,443,930, to Hwang et al. Such a sandwich structure is commonly call a polycide.

Hwang et al. proposed to use the polycide type sandwich structure for forming the gates of transistors and for forming the interconnecting conductors for integrated circuit devices. In order for the polysilicon layer to act as a conductor, the polysilicon must be doped to become either n type or p type. Hwang et al. described an interconnect scheme apparently possible to be used only for NMOS type devices.

Because of it low power requirements, CMOS type devices have superseded NMOS and other types of integrated circuit implementations in many applications. It is therefore desirable to provide an interconnect scheme which can be used for interconnecting CMOS type devices in integrated circuits.

SUMMARY OF INVENTION

One aspect of the invention is directed towards a semiconductor circuit comprising a body of silicon semiconductor material where the body has a plurality of CMOS circuit devices. The circuit further comprises a metal silicide layer in or on the body interconnecting at least two of the devices.

Another aspect of the invention is directed toward a method for interconnecting devices in a body of a silicon semiconductor material where the body includes circuit devices. The method comprises forming a polysilicon layer, a metal silicide layer, and an electrically insulating layer separating the polysilicon and metal silicide layers at at least one location to interconnect the devices.

BRIEF DESCRIPTION OF THE DRAWINGS

FIG. 7 is a schematic view of a circuit illustrating the connection of the polysilicon layer and the transistors of FIG. 6 and two additional devices connected to the transistors through the polysilicon layer.

DETAILED DESCRIPTION OF THE INVENTION

Figure 1:
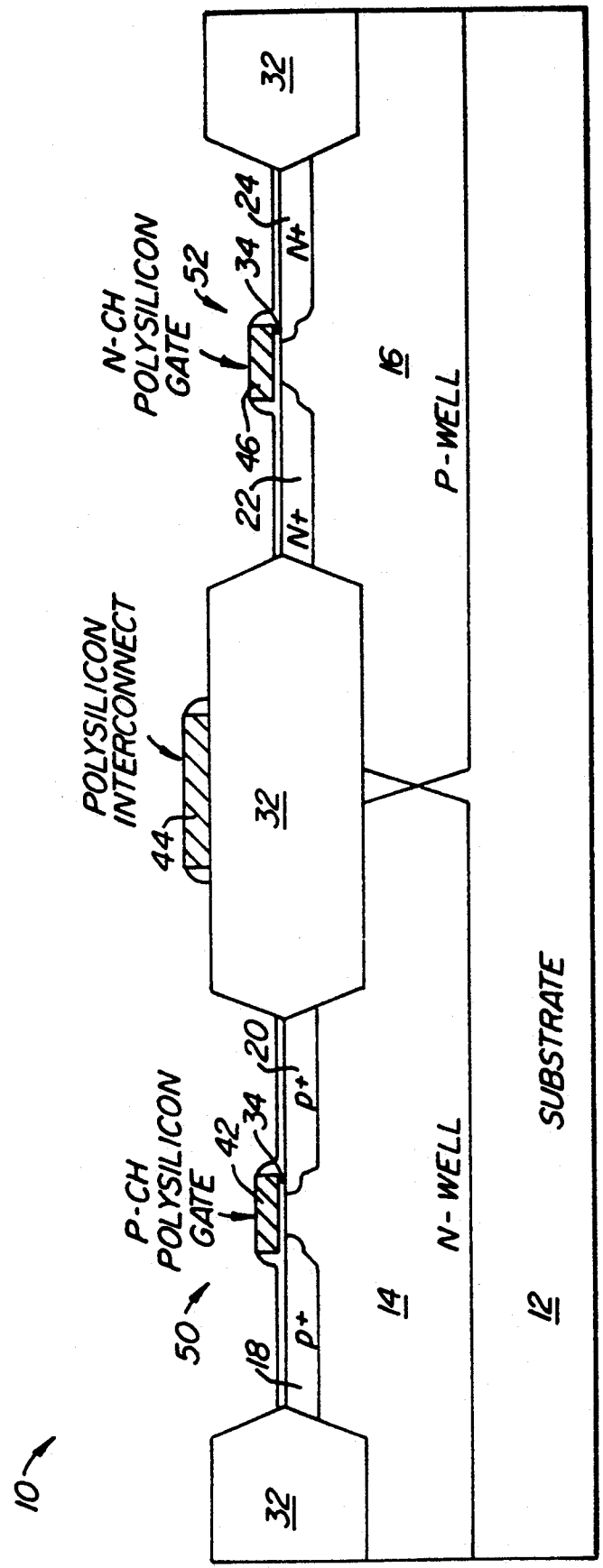
FIG. 1 is a cross-sectional view of a semiconductor wafer having CMOS devices therein onto which layers including a polysilicon layer are grown or deposited to illustrate the invention.

FIG. 1 is a cross-sectional view of a silicon wafer in which a pair of transistors forming a CMOS pair has been fabricated. Thus wafer 10 comprises a substrate 12 containing an N-well 14 and a P-well 16. The N— and P—wells are doped appropriately to form P+ regions 18, 20 and N+ regions 22, 24. A thick field oxide layer 32 and a thin gate oxide layer 34 are then provided on selected areas of the wafer as shown in FIG. 1. A polysilicon layer is also provided on selected areas on the oxide layers as shown in FIG. 1. Wafer 10 is composed of the above described components.

As shown in FIG. 1, a portion 42 of the polysilicon layer, together with P+ regions 18, 20, are part of a P-CH transistor 50. Another portion 44 of the polysilicon layer is formed on top of a portion of the field oxide 32 as shown in FIG. 1 to interconnect devices on the wafer. Yet another portion 46 of the polysilicon layer, together with N+ regions 22, 24, form a part of a N-CH transistor 52. Transistors 50, 52 together form a CMOS pair. The methods for fabricating the various regions and layers in wafer 10 shown in FIG. 1 are known to those skilled in the art and will not be described in detail herein.

The process for manufacturing an integrated circuit employing the high density local interconnect using metal silicide is illustrated in a sequence of the following numbered steps:

1. As explained above, standard integrated circuit wafer fabrication techniques are used to make the wafer 10 of FIG. 1, until the drain and source regions 18-24 have been implanted and annealed.

Figure 2:
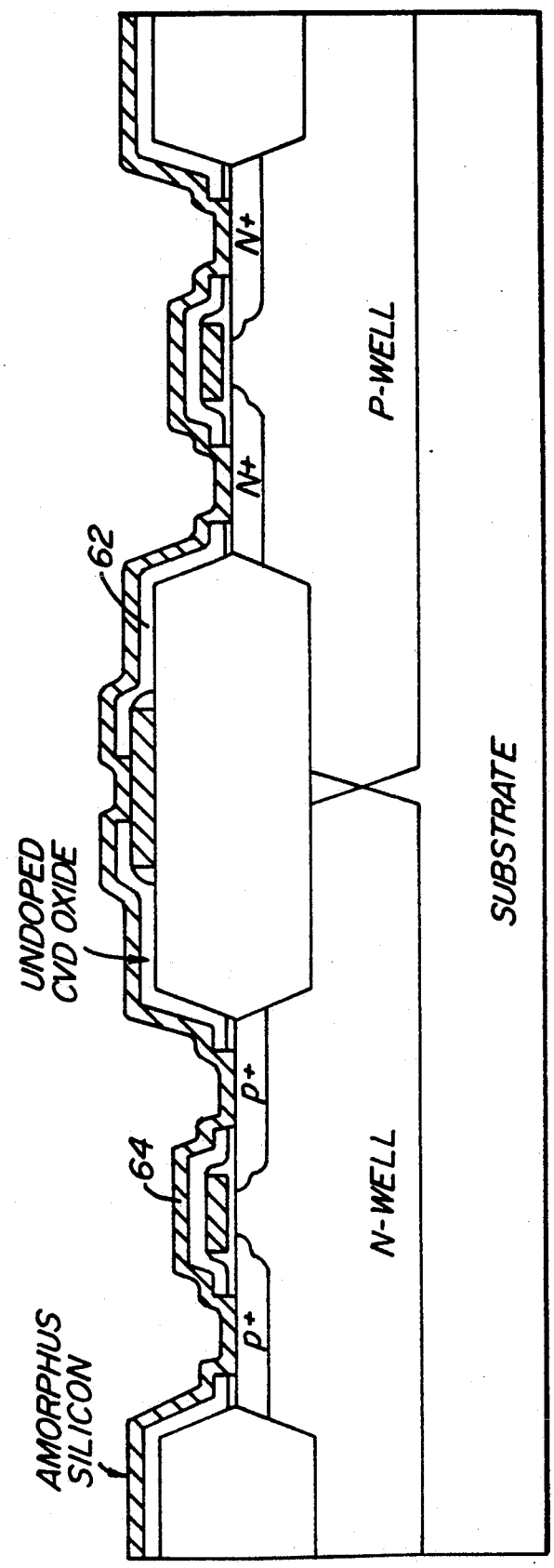
FIG. 2 is a cross-sectional view of the wafer of FIG. 1 and, in addition, of a doped CVD oxide layer and an amorphous silicon layer grown or deposited on top of the wafer of FIG. 1. Amorphous silicon layer connects to P+ silicon, N+ silicon and polysilicon at the desired location.

2. Steps 2-4 are illustrated in reference to FIG. 2 which is a cross-sectional view of the wafer 10 of FIG. 1 and, in addition, of an undoped CVD oxide and an amorphous silicon layer as shown in FIG. 2. First a layer of undoped CVD oxide is deposited onto wafer 10 by means of a conventional chemical vapor deposition method and annealed at high temperatures.

3. A photomasking step is performed to define via cuts in certain regions to connect N+, P+ regions 18-24, and portions of the polysilicon layer 44. The CVD oxide layer 62 is etched away from these regions.

4. A thin layer 64 of amorphous silicon is deposited on the entire surface of the wafer.

5. Steps 5 and 6 are illustrated in reference to FIG. 3 which is a cross-sectional view of wafer 10 of FIG. 1 together with the layers added shown in FIG. 2 and, in addition, of a masking layer 72 to illustrate the invention. The photomasking step is performed to provide a photoresist layer 72, leaving open certain regions, such as those between points 72a, 72b; and 72c, 72d.

6. High dose N+ ions are implanted into the wafer at regions that have been left unmasked by layer 72, where the energy of the implant is adjusted such that the peak of the implant is in the silicon substrate but near the interface of the thin amorphous silicon film 64 and N+ regions 22, 24 or polysilicon 44. After the implant, the photoresist layer 72 is removed by plasma ash and a chemical process using $H_2SO_4/H_2O_2$.

7. Steps 7 and 8 are illustrated in reference to FIG. 4 which is a cross-sectional view of the wafer of FIG. 3 except that photoresist 72 is replaced by a different photoresist layer 74, leaving unmasked the region between points 74a, 74b. After photoresist 72 has been removed, another photomasking step is performed to provide photoresist layer 74, leaving unmasked certain regions.

8. Now high dose P+ ion implantation is performed. The energy of the implant is adjusted such that the peak of the implant is in the silicon substrate that near the interface of the thin amorphous silicon film 64 and P+ regions 18, 20. After the implant, photoresist 74 is removed by plasma ash and a chemical process using $H_2SO_4/H_2O_2$.

9. Step 9 is illustrated in reference to FIG. 5 which is a cross-sectional view of the wafer of FIG. 4 except that the photoresist 74 has been removed and a metal silicide layer 82 is shown instead. A film of metal silicide such as tungsten silicide is deposited after the removal of photoresist 74. This is accomplished by a photomasking step followed by a plasma etching of silicide at desired regions. This silicide film interconnects the P+ region 20 to N+ region 22 and polysilicon strip 44 through the amorphous silicon layer 64.

10. Steps 10-12 are illustrated in reference to FIG. 6 which is a cross-sectional view of the wafer of FIG. 5 and, in addition, of an undoped CVD oxide layer, a doped layer of glass, and a metal interconnect layer. First a layer of undoped CVD oxide layer 92 is deposited. This is followed by deposition of a doped glass layer 94. A very short high temperature heat cycle is performed using rapid thermal annealing process (RTA). This process is used to activate the dopings, lower the sheet resistance of the metal silicide, and flow the glass film.

11. A photomasking step is now performed to define connect holes where metal connects to the metal silicide, polysilicon and N+/P+ silicon regions.

Figure 6:
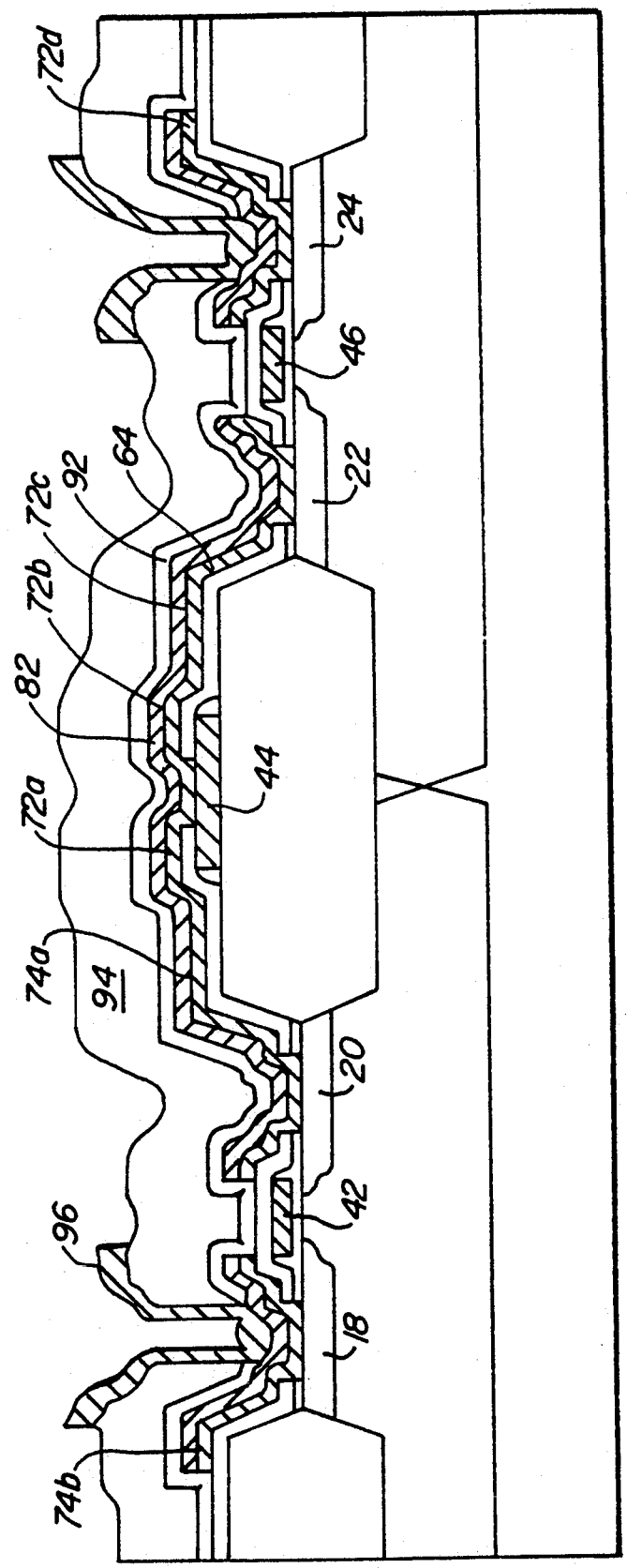
FIG. 6 is a cross-sectional view of the wafer of FIG. 5 and, in addition, an undoped CVD oxide layer, a doped glass layer, and a metal interconnect layer on the wafer of FIG. 5 forming a completed and locally interconnected circuit to illustrate the preferred embodiment of the invention.

12. This is followed by standard metal deposition and definition step whereby metal layer 96 interconnects the metal silicide, polysilicon, and N+/P+silicon regions. In FIG. 6, however, the metal layer is shown only connected to P+ and N+ regions through the silicide and amorphous silicon layers; it will be understood that the metal layer may be used to interconnect to the polysilicon portion 44 as well through the silicide and amorphous silicon layer if desired. The high density local interconnect system for interconnecting active circuit elements of the semiconductor circuit 100 is then complete.

From the above description, it will be noted that there are three layers of interconnects in the final product wafer 100 of FIG. 6. First, the polysilicon layer forms strips 42, 44, 46, where strips 42, 46 serve as gates of transistors 50, 52 and strip 44 is a polysilicon interconnect for connecting other devices of the wafer as shown in FIG. 7. The second layer of interconnect is formed by the metal silicide layers 82. However, before the interconnect system using layer 82 is described, it is first necessary to describe in more detail the composition of the amorphous silicon layer 64.

Figure 3:
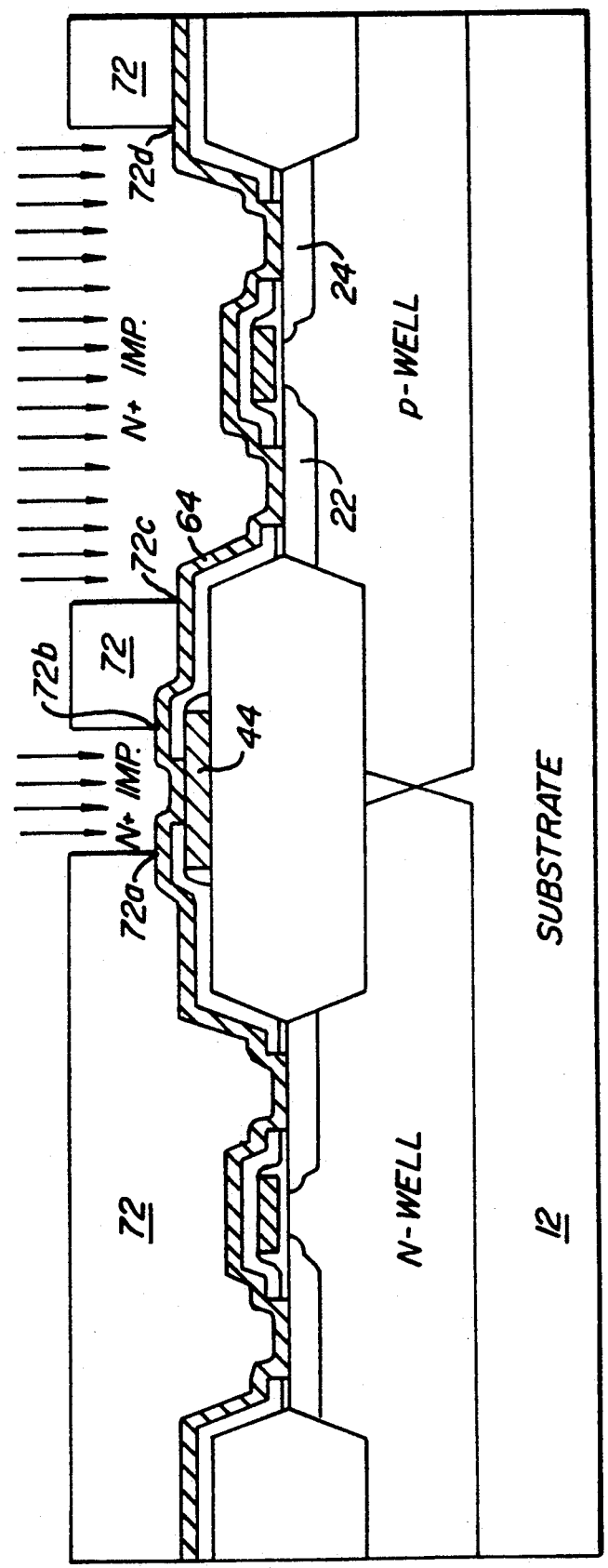
FIG. 3 is a cross-sectional view of the wafer of FIG. 2 and of a photoresist mask for doping a portion of the amorphous silicon layer by N+ implantation.

In reference to FIG. 3, it will be noted that only strips of silicon layer 64 between points 72a, 72b and between points 72c, 72d are implanted by the N+ implants so that only these portions are electrically conductive. Since the polysilicon strip 44 also has N+ implants, the N+ implants in layer 64 in contact with polysilicon layer 44 are compatible there with. In reference to FIG. 4, only the portion of layer 64 between points 74a, 74b are implanted by P+ implants, so that only such section and those described above implanted with N+ implants are electrically conductive. In reference to FIG. 5, the portion of the amorphous silicon layer 64 immediately above the polysilicon strips 42, 46 have been etched away. Thus, in reference to FIG. 6, the portion of layer 64 in contact with region 18 electrically connects region 18 to metal contact 96; since such portion of layer 64 has P+ implants, it is compatible with region 18. Similarly, the portion of layer 64 in contact with region 20 is compatible therewith and electrically connects the region to metal silicide region 82. And the N+ doped portions of layer 64 are compatible with regions 22, 24 and polysilicon strip 44 and electrically connect these portions to the silicide layer.

Figure 4:
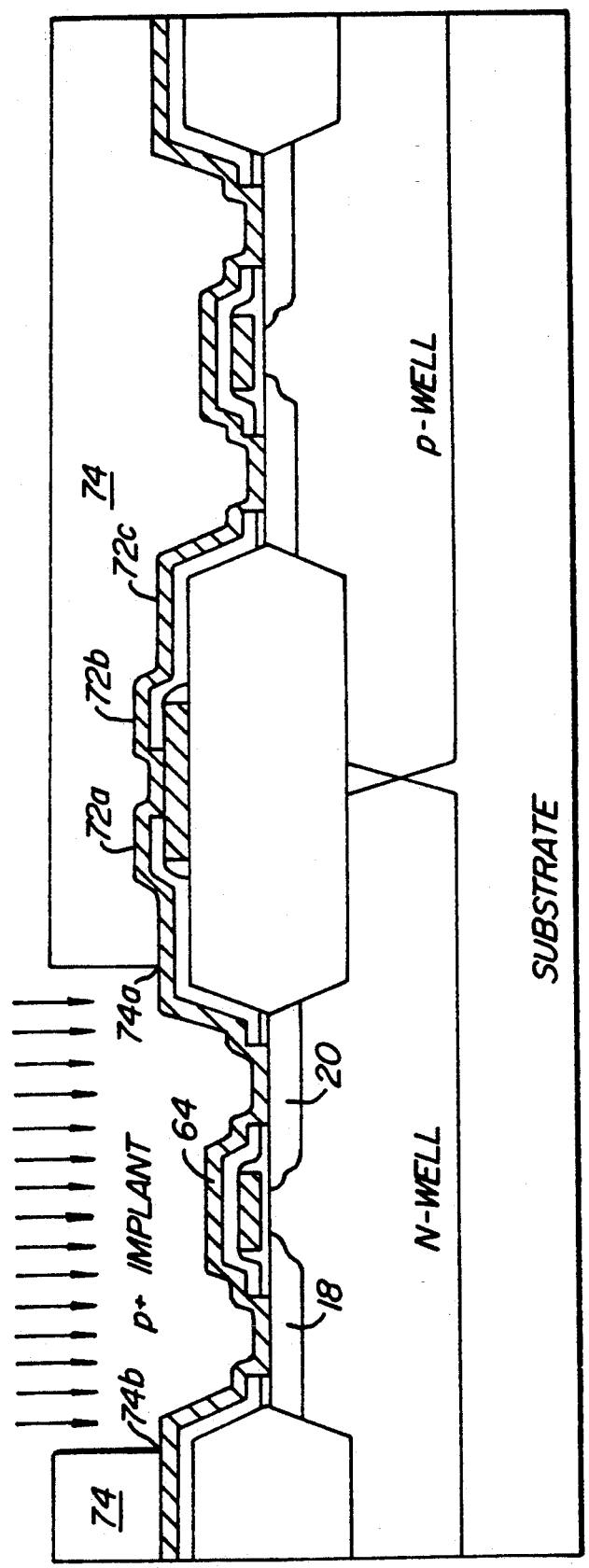
FIG. 4 is a cross-sectional view of the wafer of FIG. 2 and in addition a photoresist mask for doping another portion of the amorphous silicon layer by P+ implantation.
Figure 5:
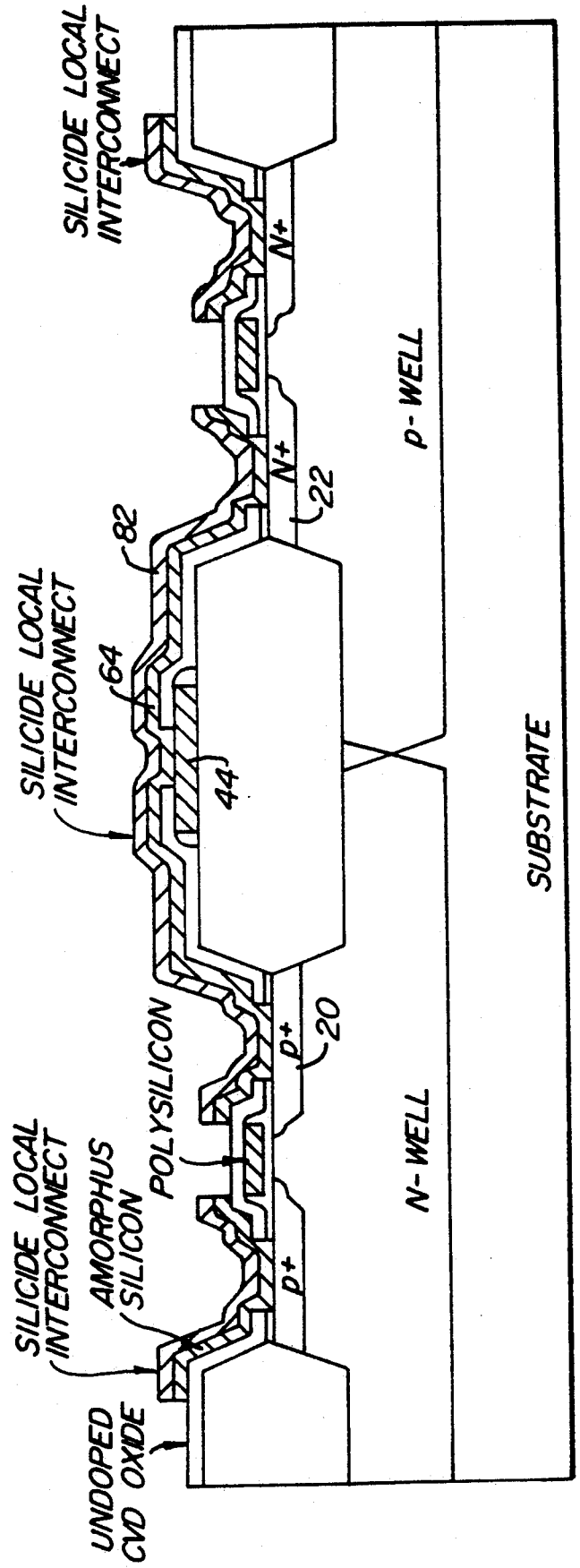
FIG. 5 is a cross-sectional view of the wafer of FIG. 2 and in addition a metal silicide local interconnect layer on selected areas of the wafer to illustrated the preferred embodiment of the invention.

The portion of layer 64 in contact with polysilicon strip 44 is separated from the portion of layer 64 connected to regions 20 by an undoped portion between points 72a, 74a in reference to FIGS. 3, 4 and 6. It will be noted that the portion of layer 64 in contact with strip 44 has N+ implants, so that, by separating such portion from the P+ implanted portion of layer 64 in contact with P+ region 20 by an undoped portion, a PN junction is prevented. The electrical connection between polysilicon layer 44 and region 20 is accomplished through the metal silicide layer 82. The portion of amorphous silicon layer 64 in contact with region 22 has been implanted with N+ implants, where such portion of layer 64 is isolated from the portion of the same layer connected to polysilicon strip 44 by an undoped portion between points 72b, 72c. By selectively implanting ions in the manner described in reference to FIGS. 3 and 4, contact channels are provided to N+ and P+ division regions in the substrate through the amorphous silicon layer without creating PN junctions; this also permits selective contacts to the N+, P+ regions and the polysilicon layer through the metal silicide layer above.

The objectives of the invention are therefore achieved. A local interconnect system employing a metal silicide layer is described herein. Since the silicide layer can be fabricated at higher density than the metal layer in the conventional one or two metal layer interconnect systems, the silicon area required for the interconnect is reduced so that the die size can be reduced for the same number of devices, or the number of devices fabricated on the same size die can be increased.

As described above, the amorphous silicon layer 64 is separated from the polysilicon layer by an undoped CVD oxide layer 62 at most locations so that the metal silicide layer can perform an interconnecting role entirely independent from the polysilicon layer. If desired, portions of the silicon layer 64 may be made to contact the polysilicon interconnect 44, as shown in the figures, to permit selective connections between the metal silicide and the polysilicon layers.

In the example described above, the amorphous silicon layer 64 is substantially identical in coverage to the metal silicide layer 82. It will be understood, however, that this is not necessary, so that the amorphous silicon layer 64 may be used for connecting the polysilicon strip 44 to the N+ region 22, for example. In other words, if the portion of layer 64 between points 72b, 72c is also implanted with N+ implants, then polysilicon strip 44 will be electrically connected to region 22 through the silicon layer 64, even if a portion of the silicide layer immediately above has been removed. In this manner, the amorphous silicon layer 64 performs an interconnect function independent from the metal silicide layer 82. By leaving a portion of the amorphous silicon undoped, it is always possible to prevent the formation of a PN junction. Preferably, the metal silicide layer is composed of a refractory metal silicide, so that the layer is stable at high temperatures.

When the invention has been described in reference to the preferred layouts and methods, it will be understood that various modifications may be made without departing from the scope of the invention which is to be limited only by the appended claims.

What is claimed is:

1. A semiconductor circuit comprising:
   a body of silicon semiconductor material, said body having a plurality of CMOS circuit devices, wherein said devices have n-type and p-type doped regions;
   a metal silicide layer interconnecting at least two of said devices;
   a polysilicon layer interconnecting at least two of the devices, at least one of said devices interconnected by the polysilicon layer being different from those interconnected by the metal silicide layer;
   an insulating layer separating the polysilicon layer from the metal silicide layer except at selected locations, if any, so that said polysilicon layer performs an interconnect function entirely independent from that of the silicide layer, said insulating layer also separating the metal silicide layer from said doped regions except at selected locations, if any; and
   an amorphous silicon layer having doped portions contacting said metal silicide layer and the n-type and p-type doped regions at locations where said insulating layer does not separate the metal silicide layer from the doped regions so that the metal silicide layer is electrically connected to the doped regions.

2. The circuit of claim 1, the devices in said body including at least two doped regions, said amorphous silicon layer having at least two doped portions, each portion located between said metal silicide layer and one of the doped regions of the body, each doped portion electrically connecting the silicide layer and one of said doped regions so that the metal silicide layer is electrically connected to the doped regions through the doped portions.

3. The circuit of claim 1, wherein one of the devices is a MOS transistor, and wherein a portion of said polysilicon layer serves as the gate of the transistor.

4. The circuit of claim 1, said insulating layer being an undoped silicon dioxide layer separating at least a portion of the metal silicide layer from the polysilicon layer.

5. The circuit of claim 1, wherein the metal silicide layer overlies at least a portion of the polysilicon layer, said portion being separated from the silicide layer by said insulating layer.

6. The circuit of claim 1, wherein said doped region is the drain or source of a transistor.

7. The circuit of claim 1, said doped region including a n+ region and a p+ region, said amorphous silicon layer having a n+ portion connected to the n+ region and a p+ portion connected to the p+ region, said p+ and n+ portions of the amorphous silicon layer being separated by an undoped portion to prevent the formation of a pn junction therein.

8. The circuit of claim 1, the devices in said body including another doped region, said circuit further comprising an amorphous silicon layer having a doped portion connecting said polysilicon layer to said another doped region so that the polysilicon layer is electrically connected to said another doped region.

9. The circuit of claim 8, wherein said another doped region is the drain or source of a transistor.

10. The circuit of claim 8, said another doped region including a n+ region and a p+ region, said amorphous silicon layer having a n+ portion connected to the n+ region and a p+ portion connected to the p+ region, said p+ and n+ portions of the amorphous silicon layer being separated by an undoped portion to prevent the formation of a pn junction therein.

11. The circuit of claim 1, further comprising a metal layer to serve as an additional connecting layer, said metal layer being separated from the body at least at one location by said metal silicide layer.

12. The circuit of claim 1, wherein said metal silicide is a refractory metal silicide.

13. The circuit of claim 1, wherein at least a portion of said polysilicon layer contains dopants so that the electrical resistivity of the layer as an interconnect is reduced.

14. A semiconductor circuit comprising:
   a body of silicon semiconductor material, said body having a plurality of circuit devices, said devices in the body including at least two doped regions;
   a metal silicide layer interconnecting said at least two doped regions; and
   an amorphous silicon layer having at least two doped portions, each portion located between said metal silicide layer and one of the doped regions of the body, each doped portion electrically connecting the silicide layer and one of said doped regions so that the metal silicide layer is electrically connected to the doped regions through the doped portions of the amorphous silicon layer.

15. The circuit of claim 14, said doped regions including a n+ region and a p+ region, said amorphous silicon layer having a n+ portion connected to the n+ portion and a p+ portion connected to the p+ region, said p+ and n+ portions of the amorphous silicon layer being separated by an undoped portion of the amorphous silicon layer to prevent the formation of a pn junction therein.

* * * * *

UNITED STATES PATENT AND TRADEMARK OFFICE
CERTIFICATE OF CORRECTION

PATENT NO. : 5,254,874
DATED : October 19, 1993
INVENTOR(S) : Manohar L. Malwah

It is certified that error appears in the above-indentified patent and that said Letters Patent is hereby corrected as shown below:

Column 7, line 7 - Column 8, line 1, Claim 15:

Replace "having a n+ portion connected to the n+ portion"

with --having a n+ portion connected to the n+ region--

Signed and Sealed this

Twenty-first Day of June, 1994

Attest:

BRUCE LEHMAN

*Attesting Officer*  *Commissioner of Patents and Trademarks*